United States Patent [19]

Meerkotter et al.

[11] Patent Number: 4,827,443
[45] Date of Patent: May 2, 1989

[54] CORRECTIVE DIGITAL FILTER PROVIDING SUBDIVISION OF A SIGNAL INTO SEVERAL COMPONENTS OF DIFFERENT FREQUENCY RANGES

[75] Inventors: Klaus Meerkotter; Ingo Kunold, both of Paderborn, Fed. Rep. of Germany

[73] Assignee: Blaupunkt Werke GmbH, Hildesheim, Fed. Rep. of Germany

[21] Appl. No.: 84,338

[22] Filed: Aug. 10, 1987

[30] Foreign Application Priority Data

Aug. 14, 1986 [DE] Fed. Rep. of Germany ....... 3627676

[51] Int. Cl.⁴ .............................................. G06F 7/38
[52] U.S. Cl. ........................... 364/724.14; 364/724.19
[58] Field of Search .......................................... 364/724

[56] References Cited

U.S. PATENT DOCUMENTS

4,288,872 9/1981 Tamburelli .................. 364/724 X
4,393,456 7/1983 Marshall, Jr. ........................ 364/724

Primary Examiner—Eugene R. LaRoche
Assistant Examiner—David Mis
Attorney, Agent, or Firm—Frishauf, Holtz, Goodman & Woodward

[57] ABSTRACT

A wave digital filter has one input set to zero and a signal to be distortion-compensated or simply to be subdivided into signals occupying different frequency ranges is supplied at the other input. The attenuation-/frequency characteristics of the respective paths from the signal input of the filter to the respective outputs have transmission functions that are complementary to each other. Further subdivision into frequency subbands is provided by cascading another such wave digital filter at one or both outputs of the first wave digital filter. The coefficients (g) of the wave digital filters can be used for control purposes. The several outputs of cascaded filters are multiplied by weighting factors and thereafter added together to provide an output compensated against variation of attenuation with respect to frequency to which the input signal has been subjected.

14 Claims, 6 Drawing Sheets

CORRECTIVE DIGITAL FILTER PROVIDING SUBDIVISION OF A SIGNAL INTO SEVERAL COMPONENTS OF DIFFERENT FREQUENCY RANGES

This invention concerns corrective digital filters and more particularly their use in filter networks for subdividing a signal, particularly an audio signal, into two or more components of different frequency range.

Digital filters have long been of importance for distortion compensation or elimination in the processing of digital audio and video signals, and for this purpose, various kinds of digital filters, particularly for adaptive distortion compensation, have been used. For digital adaptive distortion compensation of linearly distorted signals, non-recursive digital filters are frequently used, since relatively simple adaptation algorithms can be provided for the computation of the coefficients of these filters. Such filters are known, for example, from "adaptive signal processing" by B. Widrow and S. D. Stearn (Prentice Hall, 1985). The relative simplicity of these adaptation algorithms results from the fact that the transmission function of a non-recursive filter depends linearly on the coefficients.

There is a disadvantage in the known distortion compensation filters of the non-recursive digital type, because if a strong filter effect, and thereby compensation of heavy distortion by damping, is to be obtained with such filters. The order of the filter, and hence the number of coefficients to be provided, must be relatively high.

In the case of recursive filters, however, the filter effect is more marked even with a small number of filter coefficients. The transmission function of a recursive filter, however, does not depend linearly, but rather bilinearly, on its coefficients, so that more complicated and more difficult adaptation algorithms result.

SUMMARY OF THE INVENTION

It is an object of the present invention to provide an adaptive digital filter that can operate faster with the use of signal processors containing multipliers than the heretofore known adaptive filters and particularly when it can be used for removing distortion of audio signals by subdividing the signal into components occupying different frequency ranges respectively with the same relative band width.

Briefly, at least one symmetrical wave digital filter, having output branches respectively exhibiting frequency characteristics that are complementary to each other has one of its inputs supplied with a signal to be processed and the other set to zero input. The outputs generally occupy different frequency ranges. They can be respectively multiplied by filter coefficients and then added together to improve the combined signal. It is particularly useful to provide further subdivision by cascading several such wave digital filters, especially by connecting an input of another wave digital filter to at least one output of a first wave digital filter.

Wave digital filters as such are known and are described in an article by A. Fettweis, "Wave Digital Filters: Theory and Practice" in Proceedings of the IEEE, Volume 74, 1986.

The filter network of the invention has the advantage that on the one hand the transmission function depends linearly on the coefficients that are to be provided and on the other hand obtains a marked filter behavior with relatively small expense and complication. The compensation of heavy distortion resulting from differential attenuation of the signal is thereby made possible at low cost, the saving in cost being particularly significant in the implementation of the adaptation algorithm.

Although the filter network of the invention is directed to a large extent to the adaptive removal of linear distortion from signals, the invention can advantageously be utilized also for externally controllable distortion removal. By adaptive distortion removal is to be understood that distortion removal or compensation therefor which is controlled by the properties of the distorted signal, whereas the concept of "controllable distortion removal" includes also controlled operation which is carried out independently of the current properties of the distorted signal.

The invention, moreover, is not limited to merely providing a distortion compensated form of a distorted received signal. A useful application of the invention is the subdivision of a signal into components of two or more frequency regions, which components can then be transmitted further separately, in contrast to a distortion compensation or elimination system in which components are put back together again in correct phase.

It is significant also that the digital filter network of the invention can be implemented with a signal processor in which the number of computation and storage operations is so small that relatively complex filter characteristics can be made available with commercially available signal processors. Thus, subdivision into frequency sub-bands is advantageously made possible which is extensively versatile, particularly in the case of sub-bands having the same relative band width. Even with "hard-wired" implementation rather than software-assisted or firmware-assisted implementation, a relatively small expense needs to be devoted to providing storage units, multipliers and adders.

Various other particular configurations are also made useful by the invention. Thus, an all-pass filter can be connected to one output of a wave digital filter while a second wave digital filter is connected to another output of the first wave digital filter. Furthermore, the cut-off frequency, the pass-band frequency, the pass-band attenuation and the attenuation beyond cut-off, as well as the digital sampling frequency can be so chosen that for a wave digital filter of predetermined structure, a number of filter coefficients are caused to be equal to zero. Furthermore, the coefficients can be obtained by scaling a predetermined transmission function $H\mu(z)$ by the $z'=z^k$ transformation.

It may also be useful for the division into frequency sub-bands to be controllable.

The network of the invention may also contain multipliers connected to the outputs of wave digital filters and supplying their own outputs to adders. One or more of the multipliers may be furnished with control signals rather than constant coefficients.

BRIEF DESCRIPTION OF THE DRAWINGS

The invention is further described by way of illustrative example with reference to the annexed drawings, in which.

DESCRIPTION OF THE ILLUSTRATED EMBODIMENTS

In the several figures, components which are the same are designated with the same reference numerals.

Figure 1:
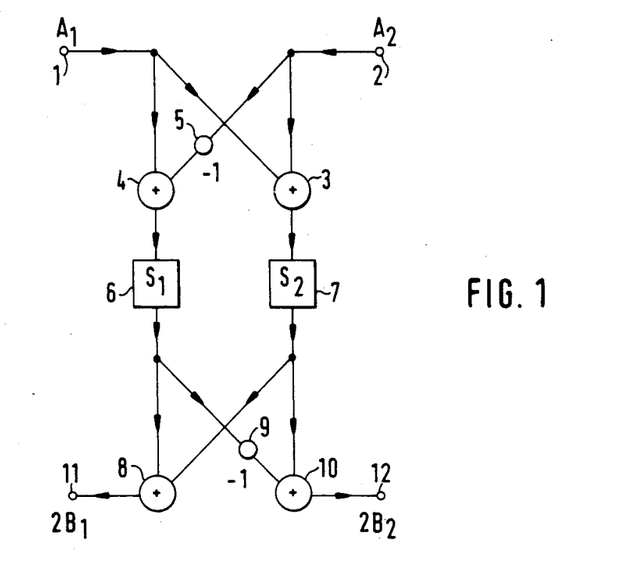
FIG. 1 is a schematic representation of a symmetrical wave digital filter.
Figure 2:
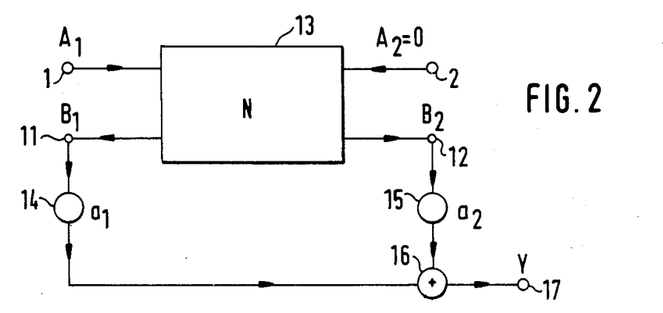
FIG. 2 is a schematic representation of a first embodiment of the invention.
Figure 3:
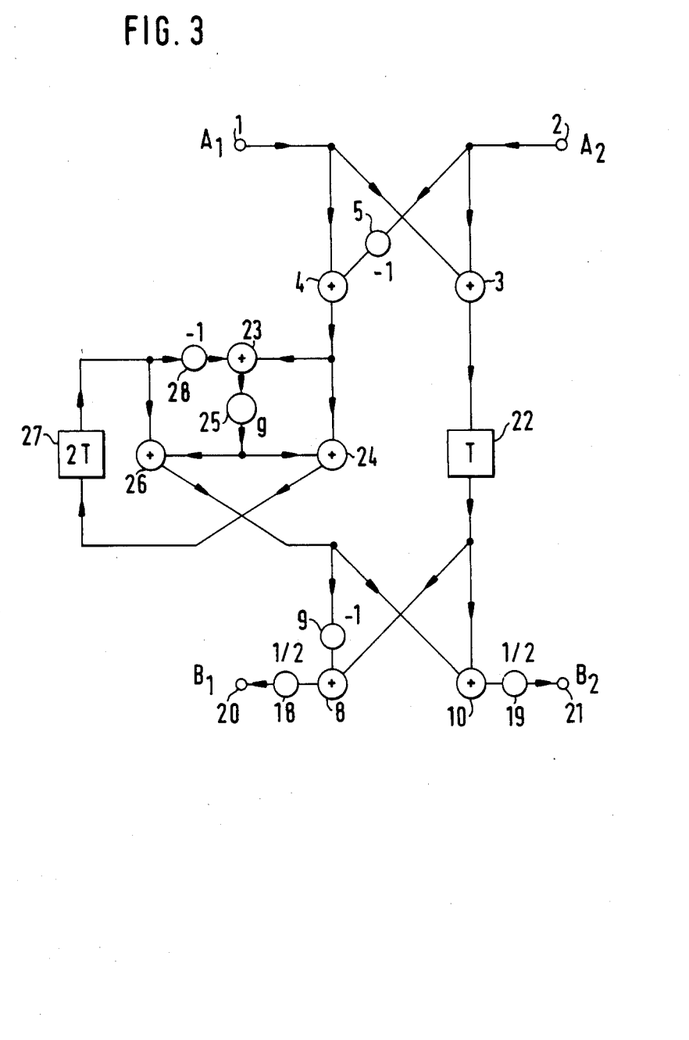
FIG. 3 is a diagram of a symmetrical wave digital filter in more detail than is shown in FIG. 1.

FIGS. 1, 2 and 3 illustrate flow diagrams for the case of implementation of the invention by means of signal processors, but they can also be understood as block circuit diagrams of a hardware implementation.

The symmetrical wave digital filter illustrated in FIG. 1 has two inputs 1, 2 to which input signals $A_1$ and $A_2$ are receptively supplied. These input signals are added together by means of a first adder 3. The input signal $A_1$ is also supplied to a second adder 4, while the input signal $A_2$ first passes through a sign reverser 5 before going to the second adder 4. The difference and the sum of the input signals thus obtained are then put through respective all-pass filters 6 and 7 respectively having the canonical reflectance $S_1$ and $S_2$.

The output signals of the all-pass circuits 6, 7 are added together to provide a first output signal $2B_1$ by means of the adder 8 and their difference is again obtained by means of a sign-reversal circuit 9 and an adder 10 to produce the output signal $2B_2$.

In the embodiment of the invention shown in FIG. 2, the outputs 11 and 12 of a symmetrical wave digital filter 13 are respectively multiplied by multipliers 14 and 15 and then added together in an adder 16 to produce the output signal Y. An input signal $A_1$ is supplied to the first input 1 of the wave digital filter 13, while no signal (zero value) is provided to the input 2 of that digital wave filter.

In the multipliers 14 and 15, the respective output signals $B_1$ and $B_2$ of the wave digital filter 13 are multiplied respectively by the coefficients $a_1$ and $a_2$. The symmetrical wave digital filter 13 is so constituted that the path between the input 1 and the output 11 has a frequency transmission characteristic which is inverse to the frequency transmission characteristic of the path between the input 1 and the output 12. In consequence, the output 11, for example, is a low-pass output, the output 12 is a high-pass output complementary thereto. By means of the coefficients $a_1$ and $a_2$ supplied to the multipliers 14 and 15, the magnitudes of the components of the output signal Y respectively in a lower and an upper frequency region can to a considerable extent be adjusted independently of each other.

The wave digital filter, designated N in FIG. 2, has as the scatter matrix $$S = \begin{bmatrix} S_{11} & S_{21} \\ S_{21} & S_{11} \end{bmatrix}$$

and is so designed that $S_{21}$ represents the transmission function of a low-pass filter and $S_{11}$ represents the transmission function of a high-pass filter.

The output signal is calculated as follows:

$$Y = H(\psi, a_1, a_2) A_1;$$

in which $\psi$ is the equivalent complex frequency.

The transmission function $H(\psi, a_1, a_2)$ is then given by the following expression:

$$H(\psi, a_1, a_2) = a_1 S_{11}(\psi) + a_2 S_{21}(\psi)$$

For $a_1 = 0$ and $a_2 = a$, the value H is equal to $S_{21}$ and thus is a low-pass filter transmission function. If the selection of $a_1 = 1$ and $a_2 = 0$ is chosen, then H represents the complementary high-pass transmission function $S_{11}$. If both coefficients are set equal to 1, the result is that H represents a transmission function of an all-pass filter. This result is by no means obvious or automatic, since it does not follow, in general, from $$|S_{11}(j\phi)|^2 + |S_{21}(j\phi)|^2 = 1$$

that $$|S_{11}(j\phi) + S_{21}(j\phi) + 1.$$

(5) follows from (4) only in the case in which $S_{11}(j\phi)$ and $S_{21}(j\phi)$ are orthogonal to each other, i.e., when $S_{11} S^*_{21} + S^*_{11} S_{21} = 0$, where the star superscript designates the complex conjugation.

In the wave digital filter shown in FIG. 3, there are shown examples for the all-pass filters 6, 7 (FIG. 1). In FIG. 3, multipliers 18 and 19 respectively follow the output adders 8 and 10 to multiply the respective adder outputs by ½ for compensating for the doubling of the amplitudes in the addition stages.

Whereas the all-pass circuit 22 simply incorporates a delay by one digital sampling interval T, the other all-pass circuit has the recursive structure described in the next paragraph.

The output signal of the adder 4 is supplied to two following adders 23 and 24. The output signal of the adder 23 is multiplied by a coefficient $g = \frac{3}{8}$ in a multiplier 25 and then supplied to the adder 24 and to an additional adder 26, the output of which constitutes the output of the all-pass circuit. The output signal of the adder 24 is delayed by two sampling intervals (2T) at 27 and then supplied to the adder 26 directly and supplied after sign change at 28 to the adder 23.

Figure 4:
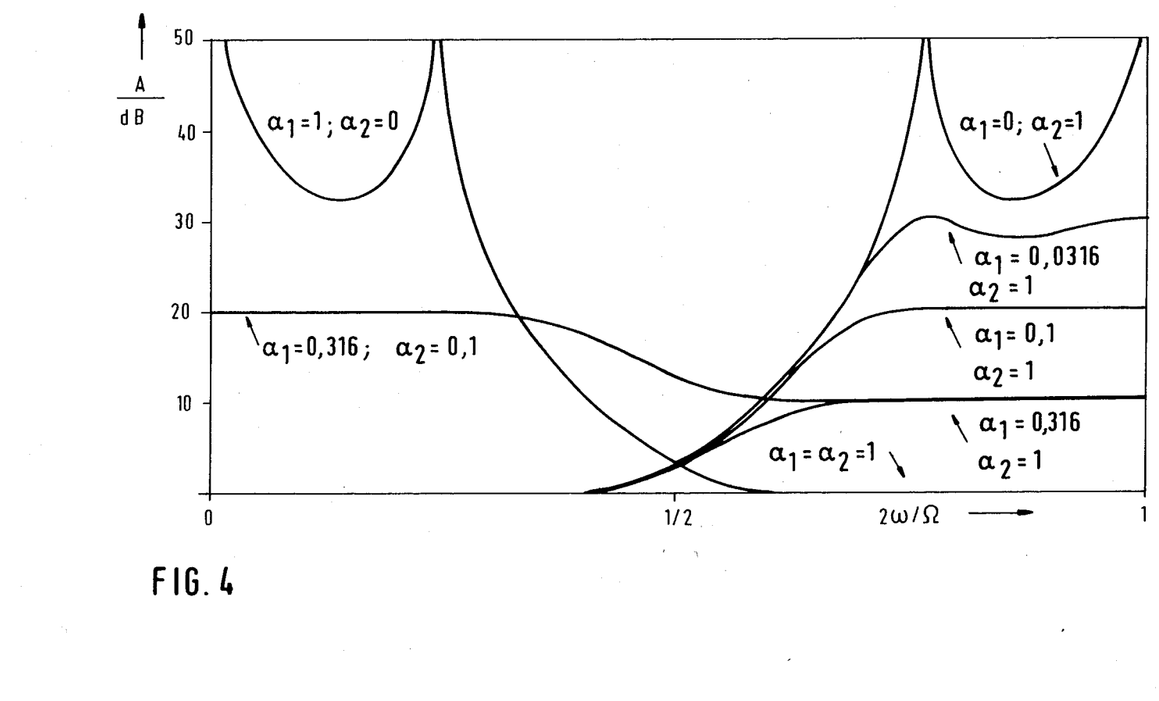
FIG. 4 is a graph of attenuation against frequency for the distortion compensator of FIG. 2 incorporating a filter according to FIG. 3.

FIG. 4 shows the attentuation A as a function of the normalized frequency for the distortion compensator of FIG. 2 incorporating a wave digital filter in accordance with FIG. 3. It is evident from FIG. 4 that the attenuation in the upper frequency region is determined by the coefficient $a_1$ and in the lower frequency region by the coefficient $a_2$. For $a_1 = a_2 = 1$, the attenuation A equals 0 dB. As the coefficients $a_1$ or $a_2$ come smaller, the attenuation in the corresponding frequency region becomes greater.

The attenuation plotted in FIG. 4 with respect to frequency shows a relatively large transition region in which it is affected by both of the coefficients $a_1$ and $a_2$. This results from the low order of the particular wave digital filter, which in this case contains only one multiplier. With the use of wave digital filters of higher order, substantially smaller transition ranges may be obtained.

Figure 5:
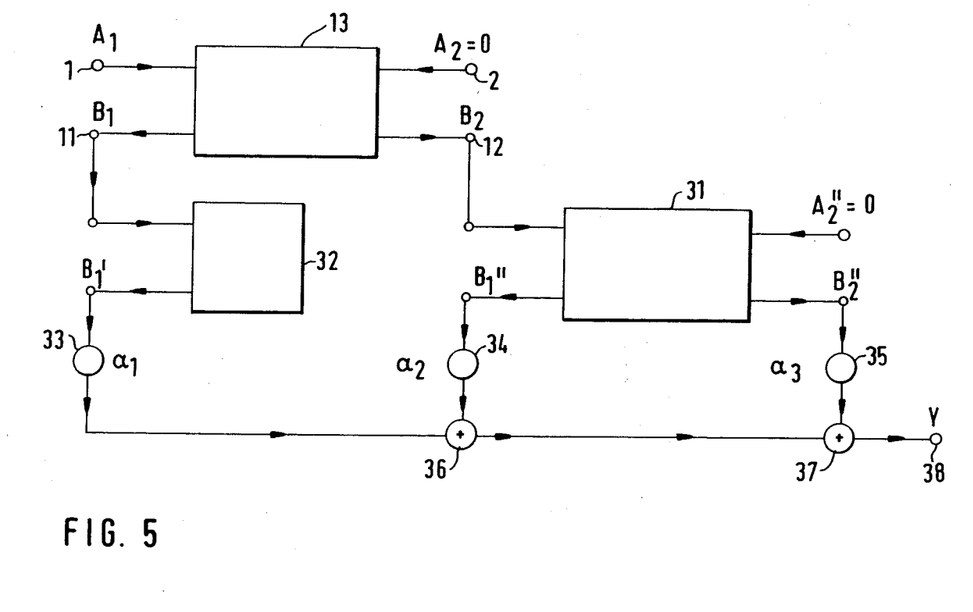
FIG. 5 is a circuit block diagram of a second embodiment of the invention.

By the use of two or more wave digital filters, it is possible to subdivide the overall frequency region into more than two frequency sub-bands. An example thereof is shown in FIG. 5. In that example, a second wave digital filter 31 is connected to follow a first wave digital filter 13 and serves to split the output signal $B_2$ of the first wave digital filter 13 into signals $B''_1$ and $B''_2$ occupying different frequency regions. The output signal $B_1$ of the wave digital filter 13 is put through an all-pass circuit 32 for matching the propagation time of the digital wave filter 31, the output signal $B'_1$ of which is multiplied with a first coefficient a1 by means of the multiplier 33. The output signals $B''_1$ and $B''_2$ of the wave digital filter 31 are respectively multiplied by the coefficients $a_2$ and $a_3$ by the multipliers 34 and 35. The outputs signals of the multipliers are then added together at 36 and 37 and the sum is provided as the output signal Y for the output 38 of the system shown in FIG. 5.

The all-pass circuit 32 can be constituted by a cascade of delay circuits if the digital wave filters 13 and 31 are suitably designed. This is the case for the digital wave filters illustrated in FIG. 3.

If it is not sufficient to subdivide the original signal into three frequency sub-bands, the all-pass circuit 32 can be replaced by still another digital wave filter, so that four sub-bands result. A further subdivision is also possible by means of the filter network shown in FIG. 6. In contrast to the arrangement of FIG. 5, in FIG. 6 the output signal $B''_2$ of the digital wave filter 33 is split into two frequency regions by means of an additional wave digital filter 41. Each of these frequency regions are "weighted" with respective coefficients $a_3$ and $a_4$ by means of the multipliers 42 and 43. An additional all-pass circuit 44 is provided for compensation of the propagation time required for passage through the wave digital filter 41. The adders 45 and 46 put together the output signals of the all-pass circuit 44 and of the wave digital filter 41 and supply the sum to the output 47.

Figure 6:
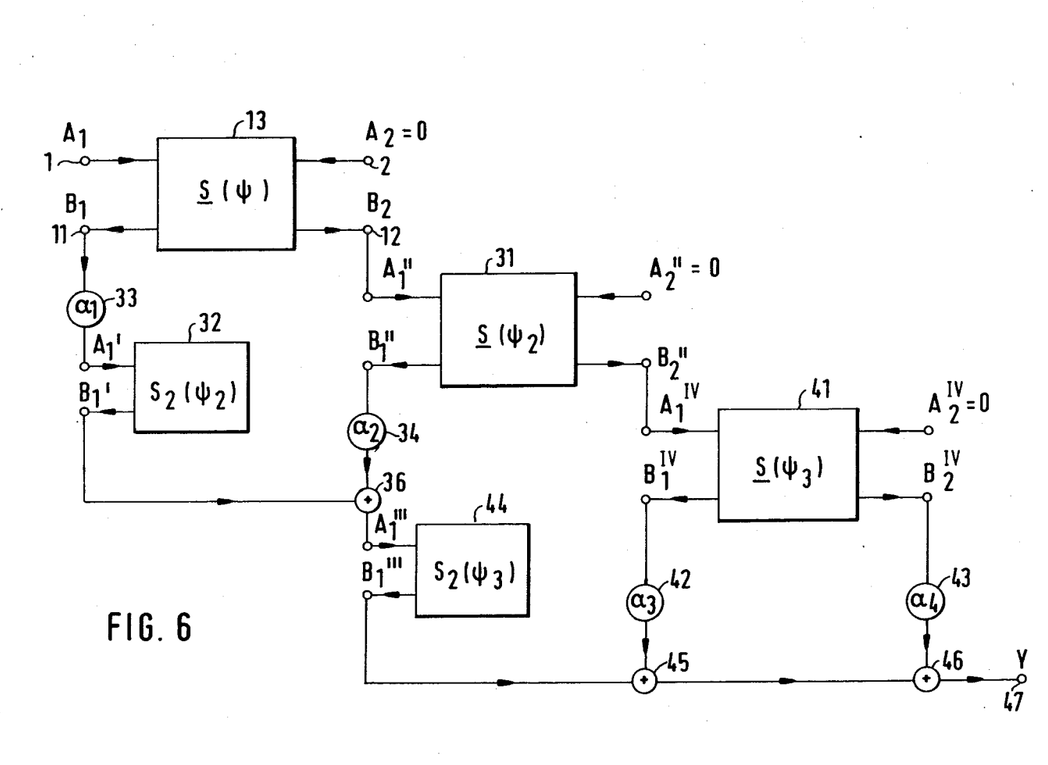
FIG. 6 is a circuit block diagram of a third embodiment of the invention.

It is possible to shift the position of the all-pass filter 44 to the other side of the preceding adder 36 and also to the other side of the multipliers 33 and 34 into the preceding filter branches without change of the transmission function. In contrast thereto, however, the illustrated arrangement is distinguished by a smaller requirement for hardware.

For the equivalent complex frequencies $\psi_2$ and $\psi_3$, the following hold:

$$\psi_2 = \frac{2\psi}{1 + \psi^2} \quad \psi_3 = \frac{2\psi_2}{1 + \psi_2^2}$$

Figure 7:
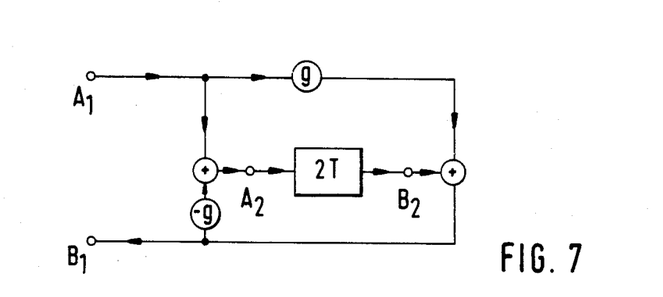
FIG. 7 is a block diagram of an all-pass filter for use in a filter network of the present invention.
Figure 8:
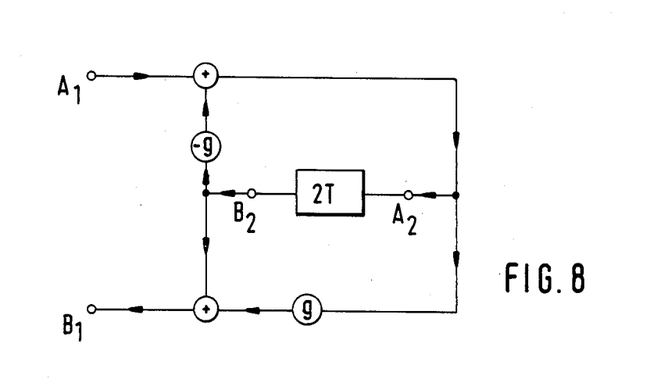
FIG. 8 is a second embodiment of an all-pass filter for use in a filter network of the invention.

The all-pass circuits of FIGS. 7 and 8, with their recursive structures, are particularly well-suited for the wave digital filters of the present invention. Transposition of the all-pass circuit according to FIG. 7 results in an equivalent all-pass circuit shown in FIG. 8. The all-pass circuits there shown are 2-port adaptors which are equipped with 2T delays at the second port.

The advantage of these adaptors is that when signal processors are used, they can work faster with multipliers than in the case of the previously known adaptors.

As already mentioned, for distortion compensation of audio signals, subdivision of the frequency range into sub-bands of the same relative band width is advantageous and can be achieved readily with the filter networks of the present invention. It has likewise already been mentioned that the division into frequency bands can be controllable. This can be done by varying the filter coefficients which are introduced by the multipliers, for example.

The coefficients of the digital wave filters can be obtained by scaling from a prescribed transmission function H $\mu z$ by means of the transformation $z' = zK$.

Filter structures can be used which are characterized by flow-graph reversal as explained, for example, in A. V. Oppenheim, R. W. Schafer; Digital Signal Processing, Englewood Cliffs: Prentice-Hall 1975. If the transposition is carried out in a digital filter structure, all addition nodes are replaced by branching nodes and all branching nodes are replaced by addition nodes besides, also, change of direction of the signal flow. The resulting structure, which is referred to as a transpose structure has the same transfer function, that is, the same filter characteristic as the original structure. Differences arise, however, for example with respect to rounding noise and overflow behavior. As a consequence of transposition, a reduction of the necessary hardware might become available. Thus, the filter means actually used may be derived from the filter means by flow-graph reversal.

Although the invention has been described by reference to particular illustrative examples, it will be understood that variations and modifications are possible within the inventive concept.

We claim:

1. Filter means for subdivision of a signal into a plurality of components of different frequency ranges comprising:
    at least one wave digital filter (13) having two outputs (11, 12) the respective paths to which from a first input of said wave digital filter have mutually complementary attenuation/frequency characteristics and having a second input at which a zero value input is continuously present.

2. Filter means according to claim 1 for compensating attenuation/frequency distortion of a signal at said input thereof, further comprising first and second multipliers at said outputs of said wave digital filter for multiplying said respective outputs by predetermined coefficients ($a_1$, $a_2$) and addition means (16) for adding together the respective outputs of said multipliers.

3. Filter means according to claim 1 comprising a plurality of wave digital filters each having, a single input providing paths respectively to two outputs which respectively attenuation/frequency characteristics, which are mutually complementary each cascade connection between one and another of said wave digital filters being provided between one of the outputs of the preceding wave digital filter in the cascade and said first input of the succeeding wave digital filter in said cascade.

4. Filter means according to claim 3, wherein each output of a first wave digital filter is connected to an input of an additional wave digital filter.

5. Filter means according to claim 3, wherein a preceding wave digital filter in said cascade has a first output connected to the input of a succeeding digital filter and a second output connecting to an all-pass propagation time compensating means.

6. Filter means according to claim 1, wherein by choice of values for stop-band attenuation, pass-band attenuation, cut-off frequency, pass frequency and digital sampling rate, said at least one wave digital filter has at least one coefficient (g) which is zero.

7. Filter means according to claim 1, wherein coefficients of said at least one digital filter are obtained by scaling from prescribed transmission functions $H\mu(z)$ by means of the transformation $z'=zK$.

8. Filter means according to claim 1, wherein frequency subdivision is made controllable by substituting a control signal for at least one coefficient (g) of said at least one digital filter.

9. Filter means according to claim 3, wherein the outputs of all wave digital filters therein are respectively connected to multipliers (14, 15, 33, 34, 35) which are in turn connected with adders (16, 36, 37) for producing a combined output of said filter means, and wherein weighting factors are supplied to said respective multipliers for multiplication of signal values therein.

10. Filter means according to claim 9, wherein at least some of said weighting factors are variable and thereby constitute control signal magnitudes.

11. Filter means according to claim 1, wherein the operation of signal storage, addition, subtraction and multiplication are performed by a signal processor in accordance with a program thereof.

12. Filter means according to claim 1, wherein said complementary transmission functions of said at least one wave digital filter are such that the sum of said functions produces an all-pass transmission function realizable by the provision of delays.

13. Filter means according to claim 1, wherein said complementary transmission functions of said at least one wave digital filter are such that the difference of said functions produces an all-pass transmission function realizable by the provision of delays.

14. Filter means according to claim 1, wherein said filter means comprise a filter derived from, or constructed by flow-graph reversal.

* * * * *